(12) United States Patent  
Nagayasu et al.

(10) Patent No.: US 9,295,172 B2
(45) Date of Patent: Mar. 22, 2016

(54) WIRE HARNESS PROTECTOR

(75) Inventors: Daiki Nagayasu, Mie (JP); Hiroaki Sakamoto, Mie (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 0 days.

(21) Appl. No.: 14/394,607

(22) PCT Filed: Apr. 24, 2012

(86) PCT No.: PCT/JP2012/060993
§ 371 (c)(1),
(2), (4) Date: Oct. 15, 2014

(87) PCT Pub. No.: WO2013/161009
PCT Pub. Date: Oct. 31, 2013

(65) Prior Publication Data
US 2015/0096779 A1  Apr. 9, 2015

(51) Int. Cl.
*H05K 5/02* (2006.01)
*H02G 3/04* (2006.01)
*B60R 16/02* (2006.01)
*H01B 7/00* (2006.01)

(52) U.S. Cl.
CPC ........... *H05K 5/02* (2013.01); *B60R 16/0215* (2013.01); *H01B 7/0045* (2013.01); *H02G 3/0487* (2013.01); *H05K 5/0247* (2013.01)

(58) Field of Classification Search
USPC ........................................ 174/72 A
See application file for complete search history.

(56) References Cited

U.S. PATENT DOCUMENTS

| 4,415,765 A | * | 11/1983 | Iwasa | H01B 7/365 174/112 |
| 4,992,626 A | * | 2/1991 | Monroe | H01R 31/02 156/51 |
| 5,367,126 A | * | 11/1994 | Kikuchi | H01B 7/0045 174/135 |

FOREIGN PATENT DOCUMENTS

| JP | 9-214142 | 8/1997 |
| JP | 2000-323858 | 11/2000 |
| JP | 2006-25515 | 1/2006 |
| JP | 2011-151993 | 8/2011 |

OTHER PUBLICATIONS

Search report from PCT/JP2012/060993, mail date is May 29, 2012.

* cited by examiner

*Primary Examiner* — Dhirubhai R Patel
(74) *Attorney, Agent, or Firm* — Greenblum & Bernstein, P.L.C.

(57) ABSTRACT

A wire harness protector includes a resin plate. A plurality of excavated portions are recessed into a panel surface of the plate, the excavated portions having a circular shape in plan view and being aligned at intervals in an X axis direction and a Y axis direction orthogonal to the X axis direction. The excavated portions are arrayed in the X axis direction in a straight line shape along the X axis direction and are arrayed in the Y axis direction in a zigzag shape, shifting a phase so as to be positioned between excavated portions neighboring each other in the X axis direction. The excavated portions neighboring each other in the Y axis direction are further arrayed so as to have portions mutually overlapping in the Y axis direction.

10 Claims, 12 Drawing Sheets

WIRE HARNESS PROTECTOR

FIELD OF THE INVENTION

The present invention relates to a wire harness protector.

BACKGROUND OF THE INVENTION

A wire harness protector described in Patent Literature 1 includes a resin plate covering a plurality of wires which configure a wire harness. A plurality of excavated portions are recessed into a panel surface of the plate. The excavated portions are configured by stripe-shaped channels extending successively and seamlessly in a direction inclined with respect to an extension direction of each wire, and are arranged so as to be mutually parallel.

RELATED ART

Patent Literature

Patent Literature 1: Japanese Patent Laid-open Publication No. 2006-25515

SUMMARY OF THE INVENTION

Problems to be Solved by the Invention

According to the above configuration, a protector can be made lightweight and strength can be ensured. However, strength is reduced in a design focusing on weight reduction, and weight cannot be reduced in a design focusing on strength, so the above configuration still cannot be said to be sufficient for both contradictory issues of reducing weight and ensuring strength, leaving room for further improvement.

The present invention was completed based on the above circumstances and reliably achieves weight reduction and ensured strength of a protector.

Means for Solving the Problems

The present invention is a plate-shaped protector made of resin and protecting a wire harness. The protector includes a plate having a plurality of excavated portions recessed into a panel surface, the excavated portions having a circular shape in plan view and being aligned at intervals in an X axis direction and a Y axis direction orthogonal to the X axis direction. The excavated portions are arrayed in the X axis direction in a straight line shape along the X axis direction and are arrayed in the Y axis direction in a zigzag shape, shifting a phase so as to be positioned between excavated portions neighboring each other in the X axis direction. In addition, the excavated portions neighboring each other in the Y axis direction are arrayed so as to have portions mutually overlapping in the Y axis direction. A resin configuring the plate is any of polypropylene, polyethylene, polyamide, polybutylene terephthalate, and polypropylene/polyethylene. Plate thickness is 0.5 to 1.0 mm in a portion where the plate has been made thinner by the excavated portions; a height of a rib between the neighboring excavated portions is 1.0 to 1.6 mm; a minimum width of a rib between the neighboring excavated portions is 1.2 to 1.5 mm; and a diameter of the excavated portion is 5 to 22 mm. In addition, the present invention is a plate-shaped protector made of resin and protecting a wire harness. The protector includes a plate having a plurality of excavated portions recessed into a panel surface, the excavated portions having a circular shape in plan view and being aligned at intervals in an X axis direction and a Y axis direction orthogonal to the X axis direction. The excavated portions are arrayed in the X axis direction in a straight line shape along the X axis direction and are arrayed in the Y axis direction in a zigzag shape, shifting a phase so as to be positioned between excavated portions neighboring each other in the X axis direction. In addition, the excavated portions neighboring each other in the Y axis direction are arrayed so as to have portions mutually overlapping in the Y axis direction. A supplemental excavated portion is recessed into a region having substantially a triangular shape in plan view, the region being situated on a rib between three neighboring excavated portions and the supplemental excavated portion having an opening diameter smaller than that of the excavated portions.

When a protector has such a configuration, strength of the protector can be sufficiently ensured because ribs having an overall lattice shape are formed extending between each excavated portion on the panel surface of the plate, intersecting in the X axis direction and the phase shift direction relative to the Y axis direction. In addition, because each excavated portion has a circular shape in plan view, stress applied to the plate by an impact or the like is dispersed evenly to a periphery of each excavated portion, and breakage of the plate caused by a concentration of stress in a particular location is avoided. Moreover, each excavated portion is recessed into the panel surface of the plate, a plurality of the excavated portions being aligned in the X axis direction and the Y axis direction, and excavated portions neighboring each other in the Y axis direction have mutually overlapping portions. Therefore, the protector can be made sufficiently lightweight. Thus, according to the present invention, weight reduction and ensured strength of the protector can be reliably achieved.

MODE FOR CARRYING OUT THE INVENTION

A concrete configuration and accompanying configurations according to the present invention are illustrated below.

A resin configuring a plate is any of polypropylene, polyethylene, polyamide, polybutylene terephthalate, and polypropylene/polyethylene. When such a resin is used, the plate retains strength enabling resistance to impact and the like and, in addition, the plate can be crafted to be lightweight. Polypropylene is particularly preferred for achieving a lightweight plate.

Plate thickness is 0.5 to 1.0 mm in a portion where the plate has been made thinner by excavated portions; a height of a rib between neighboring excavated portions is 1.0 to 1.6 mm; a minimum width of a rib between neighboring excavated portions is 1.2 to 1.5 mm; and a diameter of the excavated portion is 5 to 22 mm. As a result of thorough research over a prolonged period of time, the inventors of the present invention have learned that a plate conforming to the above numerical value ranges is preferred for both reducing weight and ensuring strength of a protector.

The diameter of the excavated portion is 12 to 22 mm. In such a case, in addition to ensuring a predetermined strength for the plate, the weight of the plate can be reduced to an extremely significant degree.

The diameter of the excavated portion is 5 to 10 mm. In such a case, in addition to achieving a predetermined reduction in weight for the plate, the strength of the plate can be ensured to an extremely favorable degree.

A supplemental excavated portion is recessed into a region having substantially a triangular shape in plan view, the region being situated on a rib between three neighboring excavated portions and the supplemental excavated portion having an opening diameter smaller than that of the excavated portions. Although a reduction in weight can be achieved by each excavated portion, when the supplemental excavated portion is provided in the triangular region on the rib, a requirement for further reduction in weight can be met. In particular, when the diameter of the excavated portion is increased, the triangular region on the rib also becomes larger and the mass of the plate increases proportionally. Therefore, when the supplemental excavated portion is provided in the triangular region, the weight of the plate can be efficiently reduced. Moreover, the supplemental excavated portion in such a case is not limited to a circular shape in plan view.

The plate is configured with a principal panel into which the excavated portions are recessed and a side panel rising up from an outer edge of the principal panel. A plurality of aligned channels extending in a direction rising up from the principal panel are provided on the side panel. Thereby, the side panel can also be made lightweight and, in addition, because the channels are provided along an escape direction of a die for molding the plate, a structure of the die does not become complicated.

Embodiment 1

Embodiment 1 is described with reference to FIGS. 1 to 15. A protector according to Embodiment 1 protects a wire harness and is configured by a plate 10. The plate 10 is made of a resin preferably selected from among polypropylene, polyethylene, polyamide, polybutylene terephthalate, and polypropylene/polyethylene (a mixture of polypropylene and polyethylene). Of these, polypropylene is more favorably used due to its high degree of strength and having the lowest specific gravity of the above-noted resins.

Figure 1:
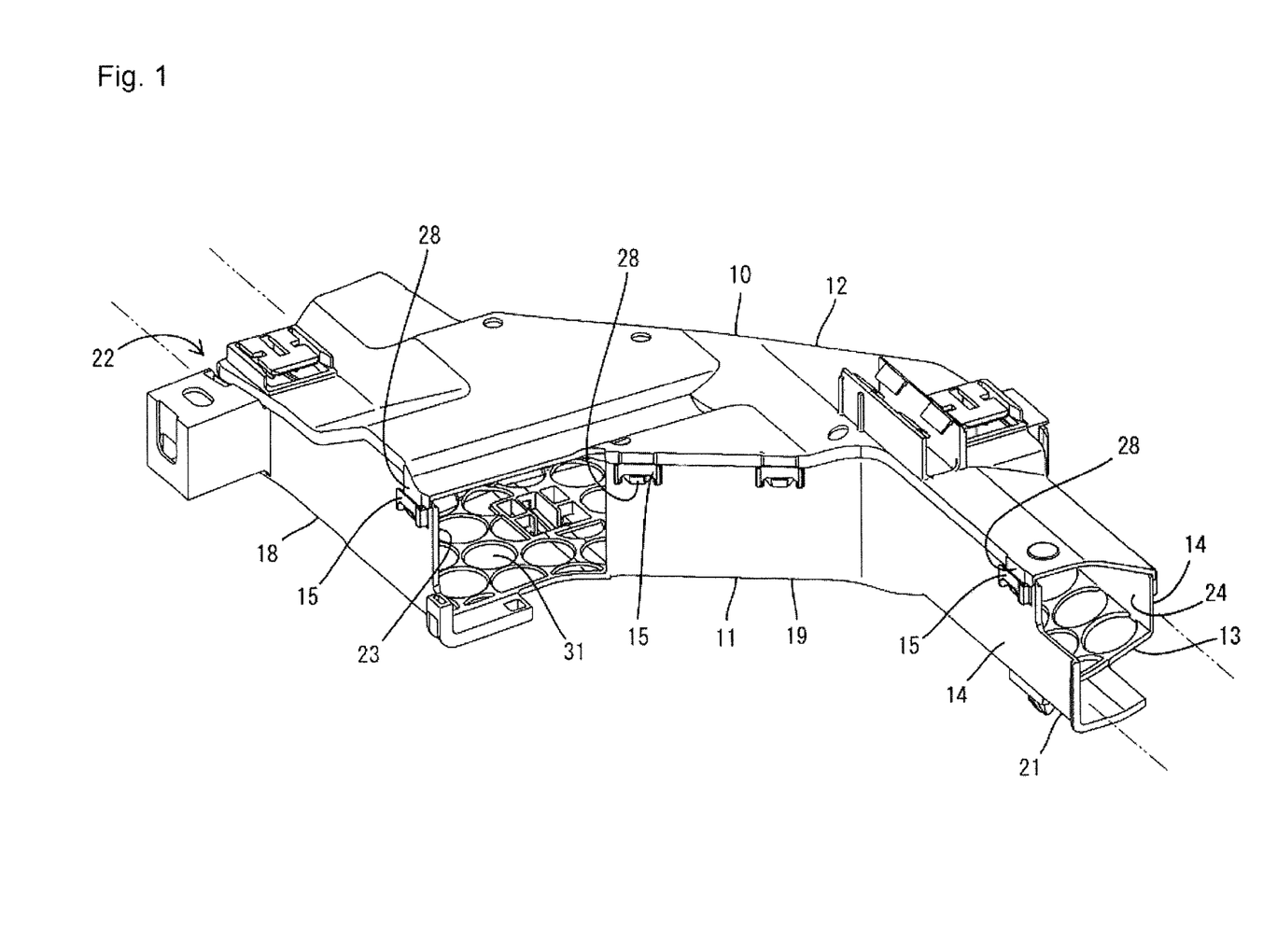
FIG. 1 is a perspective view of a wire harness protector according to embodiment 1 of the present invention.
Figure 3:
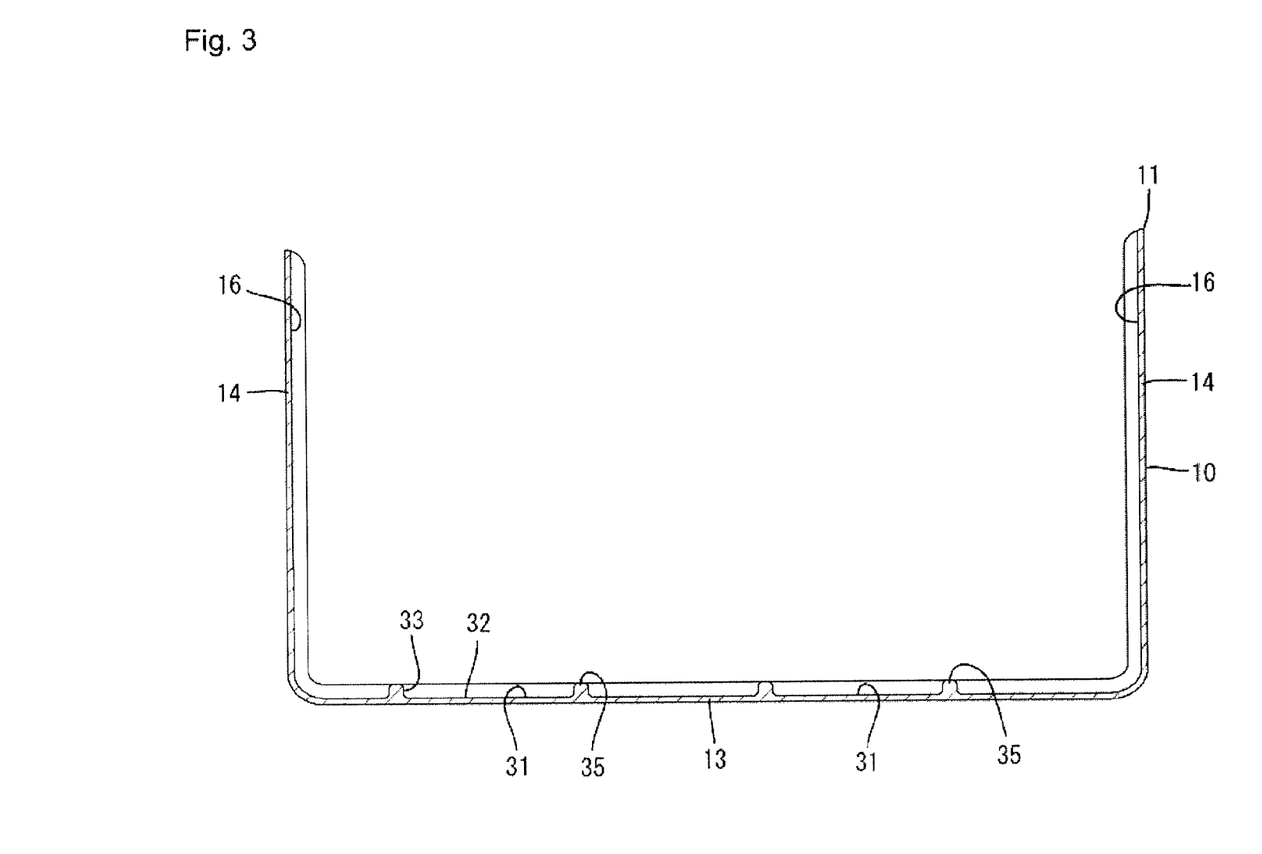
FIG. 3 is a cross-sectional view along a line A-A of FIG. 2.

The plate 10 shown in the drawings, as shown in FIG. 1, is configured with a main body member 11 and a lid member 12. As shown in FIG. 3, the main body member 11 has a squared "U" shape in cross-section and includes a flat plate-shaped principal panel 13 and a pair of flat plate-shaped side panels 14 rising up from two outer edges of the principal panel 13. A plurality of wires not shown in the drawings are supported on an inner surface of the principal panel 13, and each wire is routed along an inner surface of the side panel 14.

Figure 5:
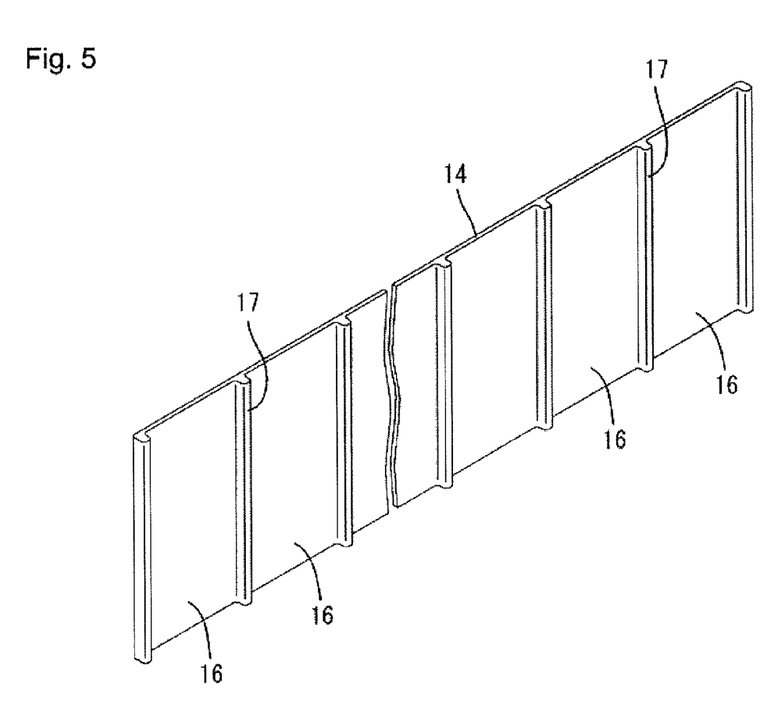
FIG. 5 is an expanded perspective view of an inner surface of a side panel.

As shown in FIG. 1, a plurality of lock receivers 15 are provided at intervals on a top edge of the side panel 14. In addition, as shown in FIG. 5, a plurality of channels 16 are recessed into the inner surface of the side panel 14. Each channel 16 has a band-like trough shape extending in a vertical direction (rising direction of the side panel 14) and opening at a top end of the side panel 14. Each channel 16 is positioned so as to be aligned in parallel at a fixed pitch along a length direction of the side panel 14. Also, each channel 16, along with an excavated portion 31 described hereafter, contributes to reducing the weight of the plate 10. In this case, the vertical direction (formation direction of each channel 16) matches an escape direction of a die (not shown in the drawings) when molding the plate 10. Therefore, complexity in a die structure can be avoided. A vertical rib 17 having a squared columnar shape and a width narrower than that of the channel 16 is provided between each of the channels 16 on the inner surface of the side panel 14.

Figure 2:
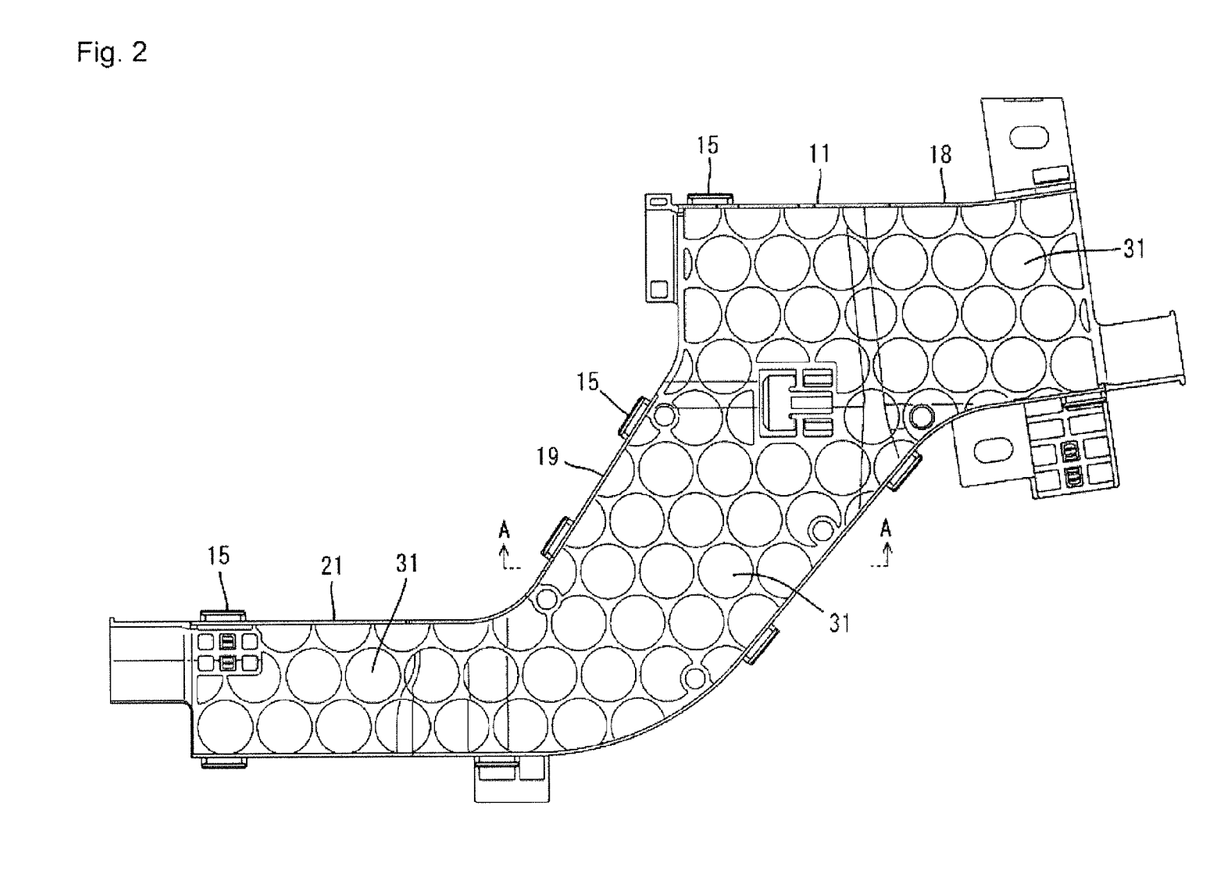
FIG. 2 is a plan view of a main body member.

As shown in FIG. 2, the main body member 11 is configured with a first main body portion 18 extending in substantially a front-back direction; a second main body portion 19 extending obliquely from an intersection at an obtuse angle with a front end of the first main body portion 18; and a third main body portion 21 extending in substantially the front-back direction from an intersection at an obtuse angle with a front end of the second main body portion 19. The front and back ends of the first main body portion 18 and the front end of the third main body portion 21 are open so as to provide openings 22, 23, and 24 from which various wires are extracted. The various wires are able to select between a routing path passing through the opening 22 on the back end of the first main body portion 18 and the opening 24 on the third main body portion 21, and a routing path passing through the opening 23 on the front end of the first main body portion 18 and the opening 24 on the third main body portion 21.

Figure 4:
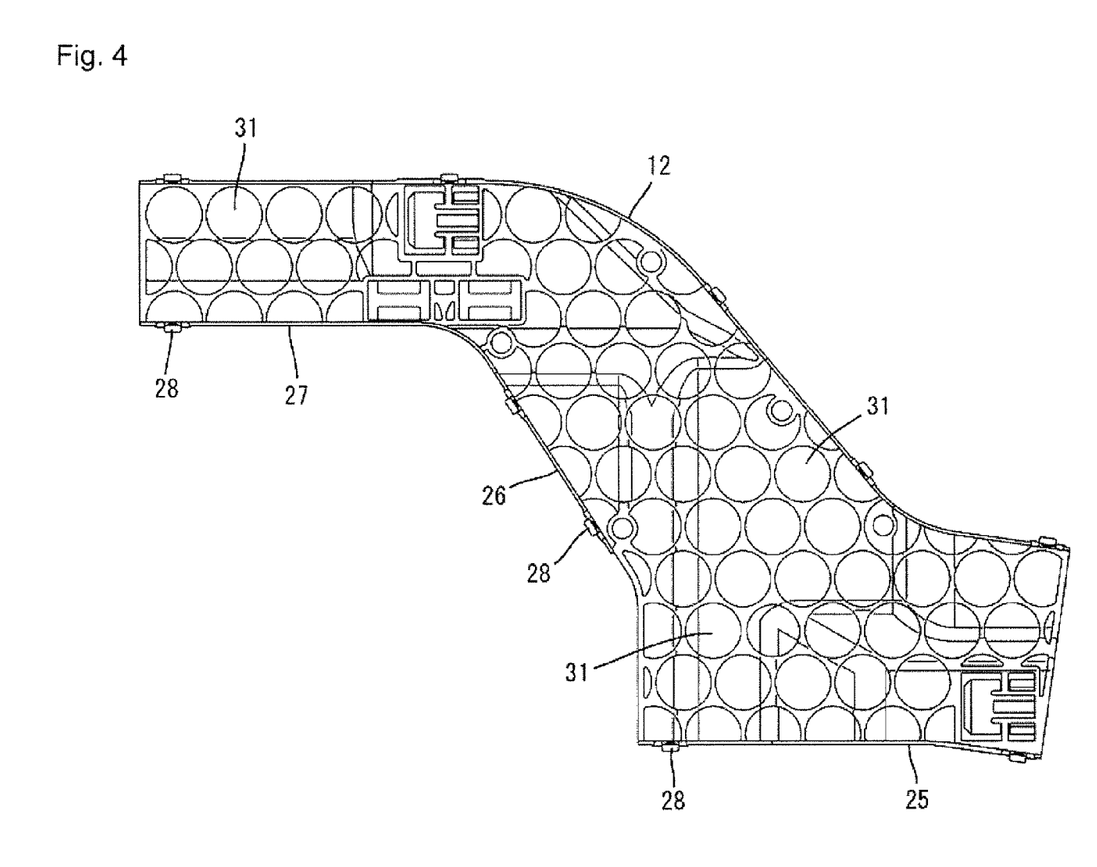
FIG. 4 is a bottom view of a lid member.

The lid member 12 is attached to a top end of the side panels 14 so as to cover the main body member 11, and has a flat plate shape facing the principal panel 13. Also, as shown in FIG. 4, the lid member 12 is configured with a first lid panel portion 25 extending in the front-back direction; a second lid panel portion 26 extending obliquely from an intersection at an obtuse angle with a front end of the first lid panel portion 25; and a third lid panel portion 27 extending in substantially the front-back direction from an intersection at an obtuse angle with the front end of the second lid panel portion 26. The first lid panel portion 25 is attached to the first main body portion 18, the second lid panel portion 26 is attached to the second main body portion 19, and the third lid panel portion 27 is attached to the third main body portion 21.

In addition, a plurality of locks 28 are formed on the outer edge of the lid member 12, projecting downward. As shown in FIG. 1, when the lid member 12 is attached to the main body member 11, each lock 28 elastically engages with each lock receiver 15, thereby fixating the lid member 12 on the main body member 11.

As shown in FIGS. 2 and 4, a plurality of the excavated portions 31 are recessed into the inner surface of the principal panel 13 and the inner surface of the side panel 12 (hereafter referred to as a panel surface of the plate 10). Each excavated portion 31 has a circular shape in plan view (specifically, a perfect circle shape in plan view), and is recessed with respect to the inner surface of the plate 10 so as to have a round columnar shape in cross-section. More specifically and as shown in FIG. 3, each excavated portion 31 is defined by a flat bottom surface 32 and a circumferential surface 33 positioned at substantially a right angle to the bottom surface 32.

Each excavated portion 31 has the same shape and size as each other excavated portion 31. In the case of Embodiment 1, the excavated portion 31 is deeper than half a thickness of the plate 10.

Figure 6:
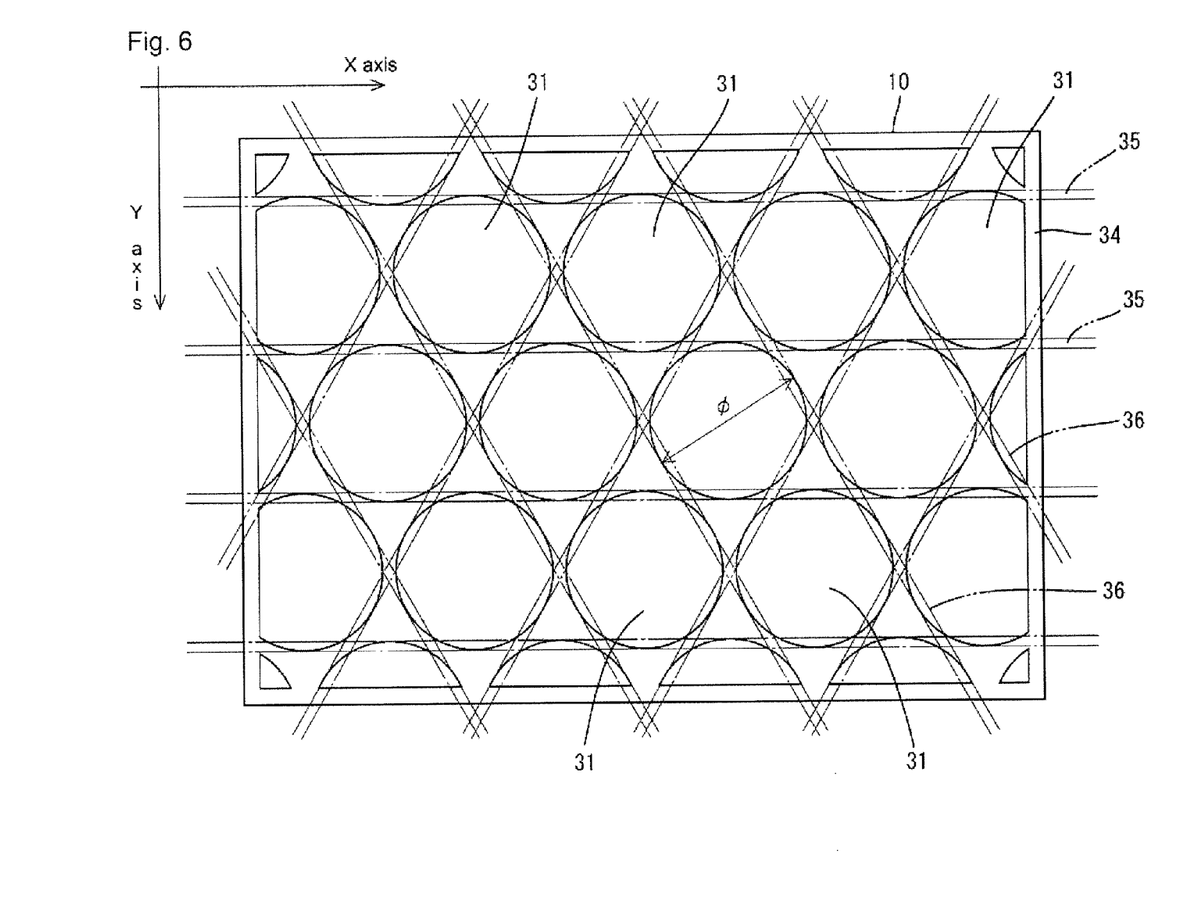
FIG. 6 is a plan view of a side panel for testing.
Figure 7:
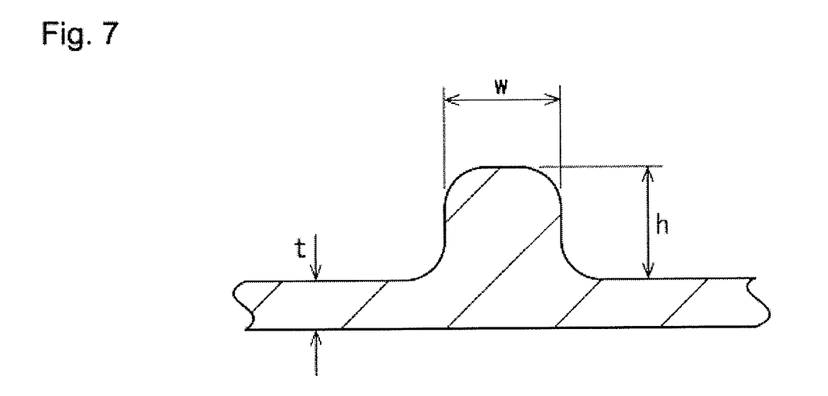
FIG. 7 is an expanded cross-sectional view of the side panel.

Also, as shown in FIG. 6, each excavated portion 31 is arrayed in parallel on the panel surface of the plate 10 with regularity in an X axis direction and a Y axis direction, which is orthogonal to the X axis direction. Specifically, each excavated portion 31 is arrayed in the X axis direction at a fixed pitch on a straight line along the X axis direction, and is arrayed in the Y axis direction in a zigzag shape, shifting a phase every half-pitch (half a distance between excavated portions 31 neighboring each other in the X axis direction) so as to be positioned between excavated portions 31 neighboring each other in the X axis direction. Moreover, the excavated portions 31 neighboring each other in the Y axis direction are arrayed so as to have portions mutually overlapping in the Y axis direction. Therefore, each excavated portion 31 is efficiently arrayed into a line at a narrow pitch on the panel surface of the plate 10, thus making the plate 10 sufficiently lightweight.

Moreover, in the case of Embodiment 1, the X axis direction is defined as the front-back direction, while the Y axis direction is defined as a width direction orthogonal to the front-back direction. In addition, an outer circumferential rib 34 is provided circling around an outer circumferential edge of the plate 10. Each excavated portion 31 positioned along the outer circumferential edge of the plate 10 has an arcuate shape in plan view due to being partially cut away by the outer circumferential rib 34.

When each excavated portion 31 is arrayed in the above-noted way, as shown in FIG. 6, a plurality of first ribs 35 are formed between the excavated portions 31 neighboring each other in the Y axis direction, the first ribs 35 extending in substantially a straight-line shape along the X axis direction, and a plurality of second ribs 36 are formed between the excavated portions 31 neighboring each other in the X axis direction, the second ribs 36 extending with incline with respect to the Y axis direction in a direction substantially following the phase shift direction. Therefore, a rib structure is formed in which each first rib 35 and each second rib 36 intersect in a lattice shape on the panel surface of the plate 10, thus ensuring that the plate 10 is sufficiently strong. Moreover, in the case of Embodiment 1, each excavated portion 31 has a circular shape in plan view, and therefore stress that occurs in the plate 10 when receiving an impact from an exterior is dispersed evenly to a periphery of each excavated portion 31, producing a structure that has excellent impact resistance.

The inventors of the present invention further performed detailed investigations to discover optimal conditions for achieving weight reduction and ensured strength in the protector. Reference numerals are the same as those above.

(1) Investigation into Diameter of Excavated Portion 31

As test plates 10, flat plates made of polypropylene were used, some having a size of 100×70 mm and others having a size of 100×45 mm. Plate thickness (hereafter referred to as plate thickness t) of a portion on the plate 10 made thin by the excavated portion 31 was set to 0.7 mm, height of the rib (hereafter referred to as rib height h) between neighboring excavated portions 31 was set to 1.4 mm, and a minimum width of the rib (hereafter referred to as rib width w) between neighboring excavated portions 31 was set to 1.4 mm (see FIG. 7). After giving the plate thickness t, rib height h, and rib width w fixed values, the diameter of the excavated portion 31 thereafter referred to as circle diameter $\phi$) was minutely altered. Moreover, the plate thickness t is equal to a distance between the bottom surface 32 of the excavated portion 31 and the outer surface of the plate 10, while the rib height h is equal to the depth of the excavated portion 31.

Figure 8:
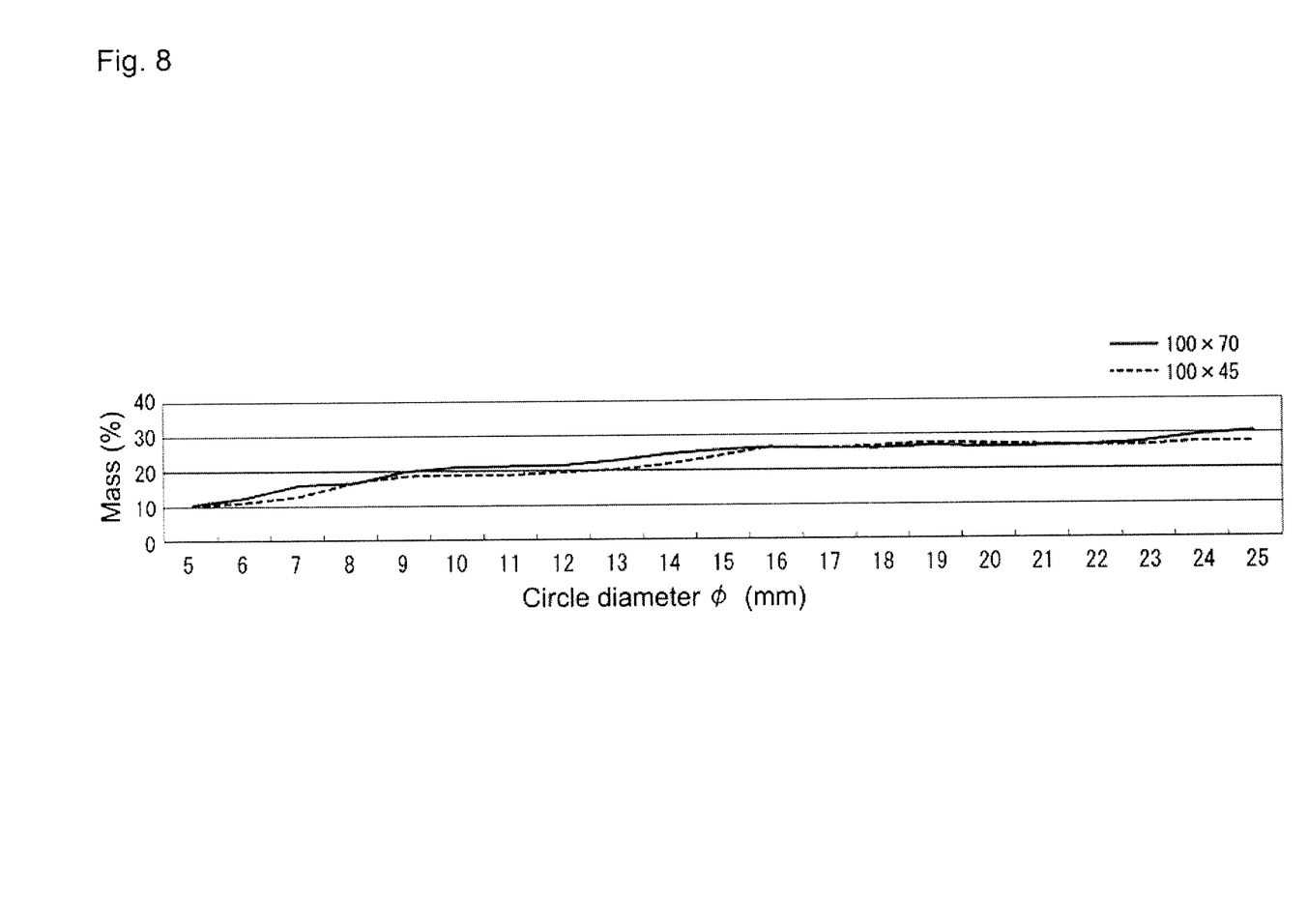
FIG. 8 is a graph illustrating a relationship between circle diameter and mass.

FIG. 8 shows a ratio of reduction in the mass of the plate 10 accompanying a change in the circle diameter $\phi$. In this case, 0% is a blank with an even plate thickness of 1.5 mm and having no excavated portions 31 provided in the panel surface of the plate 10. FIG. 8 reveals that although the mass of the plate 10 decreases as the circle diameter $\phi$ increases, when the circle diameter $\phi$ increases to a certain size, the tendency to reduce in mass levels off.

Figure 9:
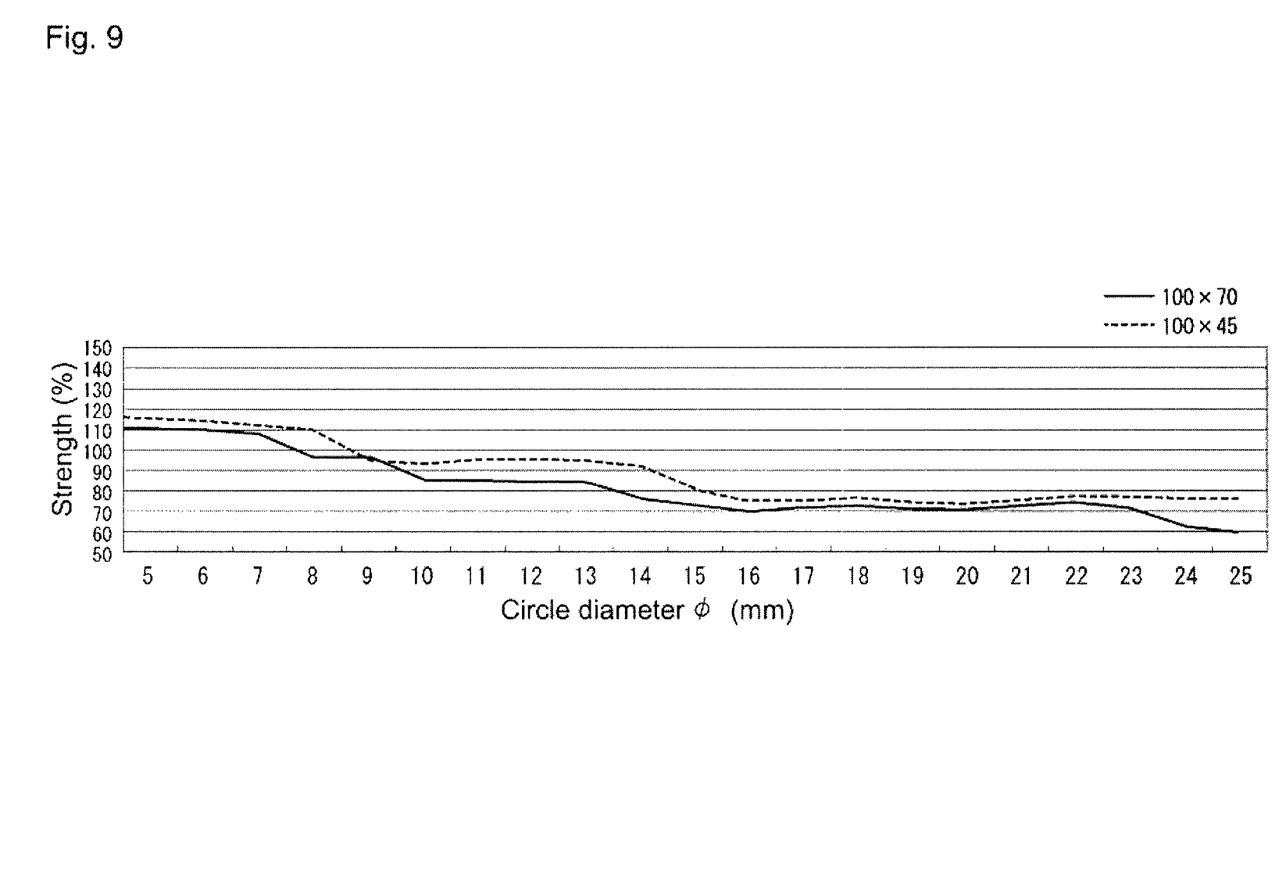
FIG. 9 is a graph illustrating a relationship between circle diameter and strength.

FIG. 9 shows a ratio of change in the strength of the plate 10 accompanying a change in the circle diameter $\phi$. In this case, 100% is a blank with an even plate thickness of 1.5 mm and having no excavated portions 31 provided in the panel surface of the plate 10. Moreover, in this case, verification and evaluation of strength is performed using flexure and torsion strength analysis software based on CATIA (registered trademark of Dassault Systems) CAE analysis (linear). FIG. 9 reveals that although the strength of the plate 10 is reduced as the circle diameter $\phi$ increases, with a circle diameter $\phi$ of 5 to 22 mm, strength is preserved at at least 70% with respect to the blank, which is within a range of acceptable success in practical terms. Furthermore, with the circle diameter $\phi$ at 12 to 22 mm, a reduction in strength is significantly inhibited and substantially levels out when the circle diameter $\phi$ is more than 16 mm. Also, at a range of 12 to 22 mm for the circle diameter $\phi$ in FIG. 8, the mass of the plate 10 is reduced by 20% or more with respect to the blank, and therefore being in the same range is extremely useful in achieving weight reduction and ensured strength of the plate 10. In addition, with the circle diameter $\phi$ at 5 to 10 mm, strength is kept approximately the same as that of the blank and no substantive reduction in strength is observed, and so strength equivalent to the state of the art can be maintained. Accordingly, from the viewpoint of ensuring strength, a circle diameter $\phi$ of 5 to 10 mm is useful.

(2) Investigation into Plate Thickness t

The material and size of the plate 10 were made identical to the above, the rib height h was set to 1.4 mm, the rib width w was set to 1.4 mm, the circle diameter $\phi$ was set to 17 mm, and the plate thickness t was minutely altered.

Figure 10:
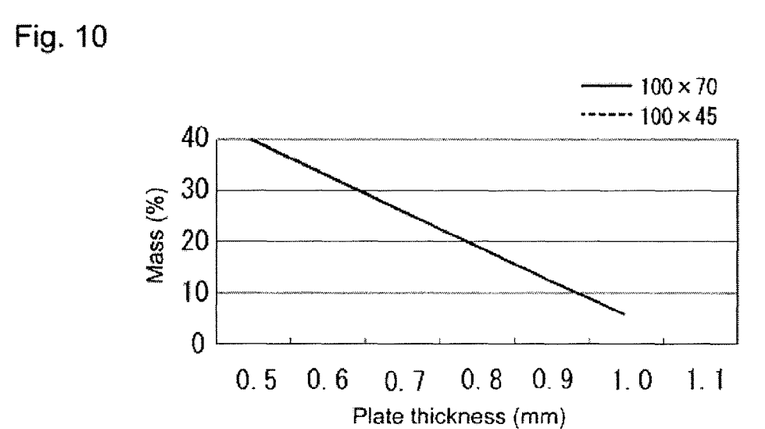
FIG. 10 is a graph illustrating a relationship between plate thickness and mass.
Figure 11:
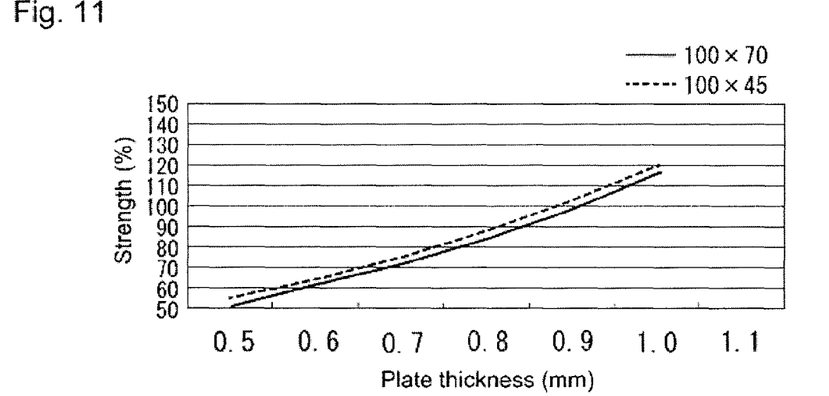
FIG. 11 is a graph illustrating a relationship between plate thickness and strength.

FIG. 10 illustrates a state in which the mass of the plate 10 increases accompanying an increase in the plate thickness t. Meanwhile, FIG. 11 illustrates a state in which the strength of the plate 10 increases accompanying an increase in the plate thickness t. The plate thickness t is preferably 0.5 to 1.00 mm, a range for ordinary use. In addition, when the plate thickness t is 0.6 to 0.8 mm, the mass of the plate 10 is reduced by at least 20% and the strength is preserved at at least 70%, and therefore this plate thickness t is more preferred.

(3) Investigation into Rib Width w

The material and size of the plate 10 were made identical to the above, the board thickness t was set to 0.7 mm, the rib height h was set to 1.4 mm, the circle diameter $\phi$ was set to 17 mm, and the rib width w was minutely altered.

Figure 12:
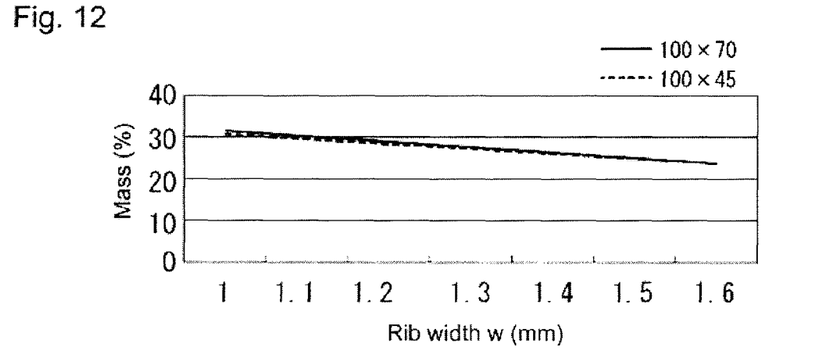
FIG. 12 is a graph illustrating a relationship between rib width and mass.
Figure 13:
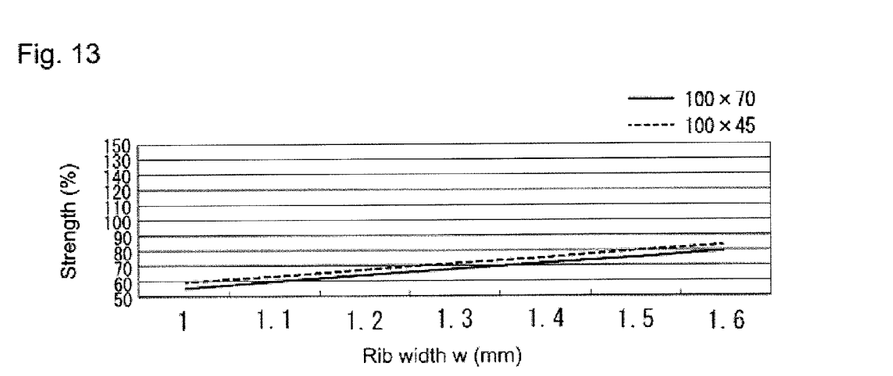
FIG. 13 is a graph illustrating a relationship between rib width and strength.

FIG. 12 illustrates a state in which the mass of the plate 10 increases accompanying an increase in the rib width w. Meanwhile, FIG. 13 illustrates a state in which the strength of the plate 10 increases accompanying an increase in the rib width w. The rib width w is in the range of ordinary use, and is preferably 1.2 to 1.5 mm, where the mass of the plate 10 is reduced by at least 20% and the strength is preserved at at least 70%.

(4) Investigation into Rib Height h

The material and size of the plate 10 were made identical to the above, the plate thickness was set to 0.7 mm, the rib width w was set to 1.4 mm, the circle diameter φ was set to 17 mm, and the rib height h was minutely altered.

Figure 14:
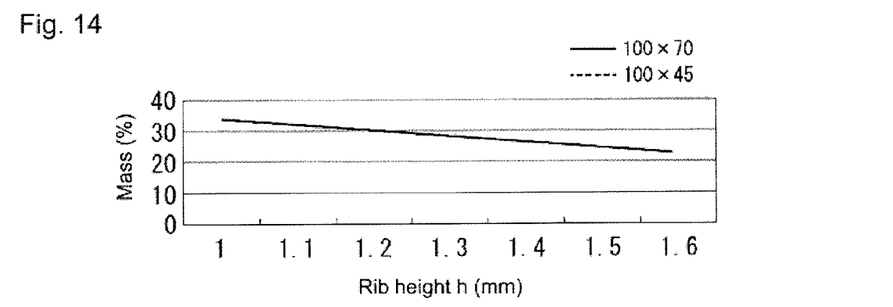
FIG. 14 is a graph illustrating a relationship between rib height and mass.
Figure 15:
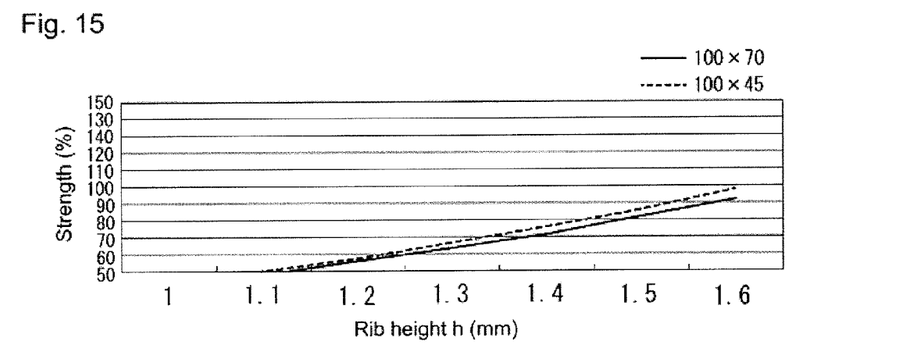
FIG. 15 is a graph illustrating a relationship between rib height and strength.

FIG. 14 illustrates a state in which the mass of the plate 10 increases accompanying an increase in the rib height h. Meanwhile, FIG. 15 illustrates a state in which the strength of the plate 10 increases accompanying an increase in the rib height h. The rib height h is preferably 1.0 to 1.6 mm, the range for ordinary use.

The detailed investigations noted above reveal that conditions favorable for both reducing weight and ensuring strength of the plate 10 are a plate thickness t of 0.5 to 1.0 mm, a rib height h of 1.0 to 1.6 mm, a rib width w of 1.2 to 1.5 mm, and a circle diameter φ of 5 to 22 mm. In this case, when the circle diameter φ is 12 to 22 mm, in addition to ensuring that the strength of the plate 10 is at a predetermined level or greater, the weight of the plate 10 can be reduced to an extremely significant degree. Meanwhile, when the circle diameter φ is 5 to 10 mm, in addition to reducing the mass of the plate 10 to a predetermined level or greater, the strength of the plate 10 can be ensured to an extremely favorable degree.

Embodiment 2

Figure 16A:
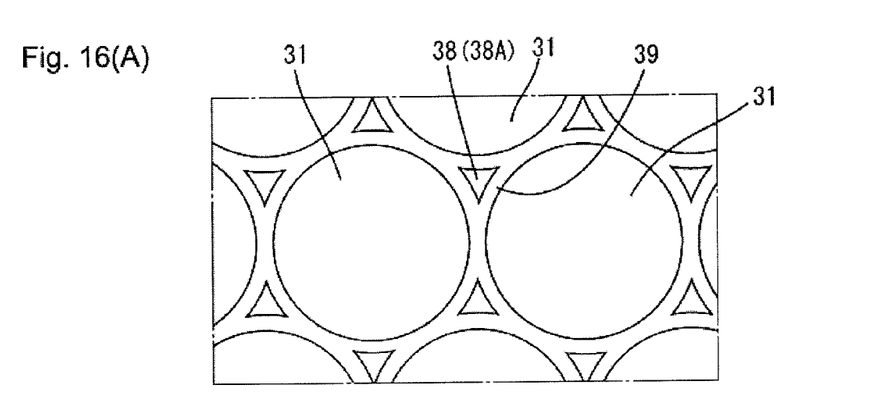
FIGS. 16(A) to 16(C) are expanded plan views of various shapes for supplemental excavated portions.
Figure 16B:
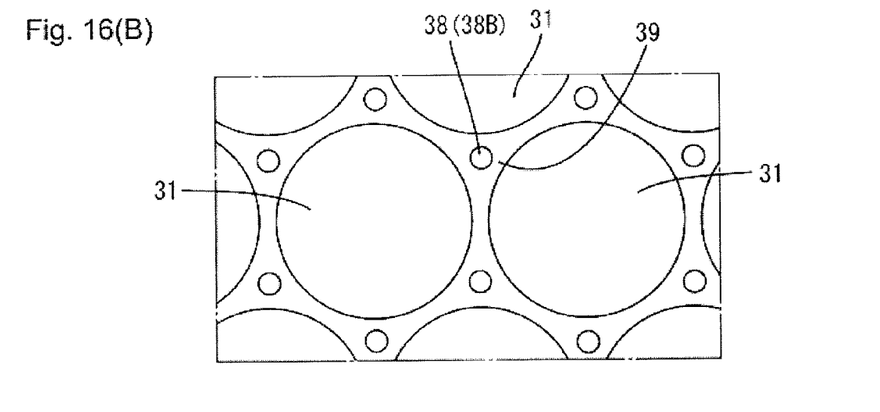
Figure 16C:
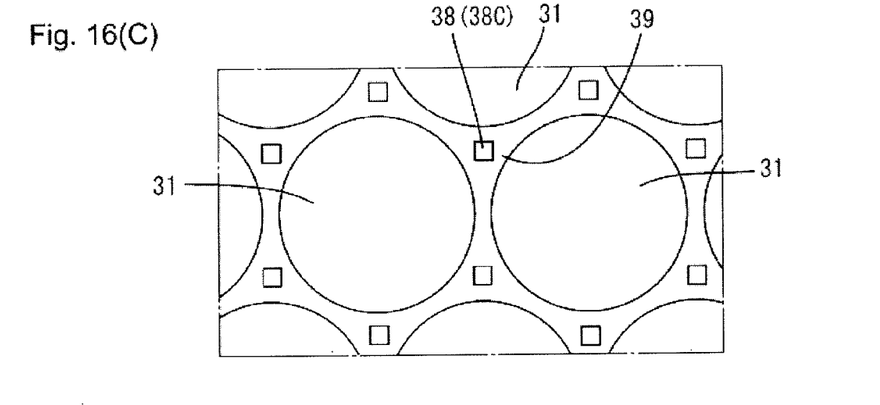

FIG. 16 illustrate Embodiment 2. In Embodiment 2, a supplemental excavated portion 38 is recessed into a region having substantially a triangular shape in plan view (hereafter referred to as a triangular region 39), the region being situated on a rib between three neighboring excavated portions 31 and the supplemental excavated portion 38 having a diameter smaller than that of the excavated portions 31. In other respects, Embodiment 2 is similar to Embodiment 1.

For example, a supplemental excavated portion 38A shown in FIG. 16(A) has, in plan view, a curved triangular shape following an arc of each of the three neighboring excavated portions 31. A supplemental excavated portion 38B shown in FIG. 16(B) has a circular shape in plan view, and a supplemental excavated portion 38C shown in FIG. 16(C) has a square shape in plan view. The supplemental excavated portions 38 may have other polygonal shapes as well, such as a hexagonal shape in plan view. In addition, the supplemental excavated portions 38 are not necessarily provided in all of the triangular regions 39 on the panel surface of the plate 10, and may instead be provided in only some of the triangular regions 39.

According to Embodiment 2, the supplemental excavated portions 38 are provided to the panel surface of the plate 10, in addition to the excavated portions 31, and so the plate 10 can be made more lightweight. In particular, the triangular region 39 becomes larger as the diameter of each excavated portion 31 increases, and the mass of the plate 10 tends to increase proportionally. Therefore, by providing the supplemental excavated portion 38 in the triangular region 39, the reduction in weight of the plate 10 can be achieved effectively.

The present invention is not limited to the above description and drawings, and may also have the following aspects.

(1) The X axis direction and the Y axis direction may be defined in any direction, respectively, so long as the directions are in a mutually orthogonal relationship.

(2) Each excavated portion may be provided in the outer surface of the plate, or may be provided in both the inner and outer surfaces of the plate.

(3) The channels need not be provided on the inner surface of the side panel, or excavated portions may be provided to the inner surface of the side panel instead of the channels.

(4) The panel surface of the plate may be curved.

(5) The excavated portion may have a shape recessed into the panel surface of the plate in a "U" shape or a "V" shape in cross-section.

(6) The size of the plate (size in a panel surface direction) is arbitrary.

(7) The lid member may be integrally connected to the main body member via a hinge.

DESCRIPTION OF REFERENCE NUMERALS

10 . . . Plate
13 . . . Principal panel
14 . . . Side panel
16 . . . Channel
31 . . . Excavated portion
35 . . . First rib
36 . . . Second rib
38 . . . Supplemental excavated portion
39 . . . Triangular region (region having substantially a triangular shape in plan view and situated on a rib between three neighboring excavated portions)

The invention claimed is:

1. A plate-shaped wire harness protector made of resin and protecting a wire harness, the protector comprising:
    a plate having a plurality of excavated portions recessed into a panel surface, the excavated portions having a circular shape in plan view and being aligned at intervals in an X axis direction and a Y axis direction orthogonal to the X axis direction, the excavated portions being arrayed in the X axis direction in a straight line along the X axis direction and arrayed in the Y axis direction in a zigzag, shifting a phase so as to be positioned between excavated portions neighboring each other in the X axis direction, the excavated portions neighboring each other in the Y axis direction being further arrayed so as to have portions mutually overlapping in the Y axis direction,
    wherein a resin configuring the plate is any of polypropylene, polyethylene, polyamide, polybutylene terephthalate, and polypropylene/polyethylene, and
    plate thickness is 0.5 to 1.0 millimeter in a portion where the plate has been made thinner by the excavated portions; a height of a rib between neighboring excavated portions is 1.0 to 1.6 millimeter; a minimum width of the rib between neighboring excavated portions is 1.2 to 1.5 millimeter; and a diameter of the excavated portion is 5 to 22 millimeter.

2. The wire harness protector according to claim 1, wherein the diameter of the excavated portion is 12 to 22 mm.

3. The wire harness protector according to claim 2, wherein the plate is configured with a principal panel into which the excavated portions are recessed and a side panel rising up from an outer edge of the principal panel, a plurality of aligned channels extending in a direction rising up from the principal panel being provided on the side panel.

4. The wire harness protector according to claim 1, wherein the diameter of the excavated portion is 5 to 10 millimeter.

5. The wire harness protector according to claim 4, wherein the plate is configured with a principal panel into which the excavated portions are recessed and a side panel rising up from an outer edge of the principal panel, a plurality of aligned channels extending in a direction rising up from the principal panel being provided on the side panel.

6. The wire harness protector according to claim 1, wherein the plate is configured with a principal panel into which the excavated portions are recessed and a side panel rising up from an outer edge of the principal panel, a plurality of aligned channels extending in a direction rising up from the principal panel being provided on the side panel.

7. A plate-shaped protector made of resin and protecting a wire harness, the protector comprising:

a plate having a plurality of excavated portions recessed into a panel surface, the excavated portions having a circular shape in plan view and being aligned at intervals in an X axis direction and a Y axis direction orthogonal to the X axis direction, the excavated portions being arrayed in the X axis direction in a straight line along the X axis direction and arrayed in the Y axis direction in a zigzag, shifting a phase so as to be positioned between excavated portions neighboring each other in the X axis direction, the excavated portions neighboring each other in the Y axis direction being further arrayed so as to have portions mutually overlapping in the Y axis direction, wherein a supplemental excavated portion is recessed into a region having substantially a triangular shape in plan view, the region being defined by a portion of a rib between three neighboring excavated portions and the supplemental excavated portion having an opening diameter smaller than that of the excavated portions.

8. The wire harness protector according to claim 7, wherein a resin configuring the plate is any of polypropylene, polyethylene, polyamide, polybutylene terephthalate, and polypropylene/polyethylene.

9. The wire harness protector according to claim 8, wherein the plate is configured with a principal panel into which the excavated portions are recessed and a side panel rising up from an outer edge of the principal panel, a plurality of aligned channels extending in a direction rising up from the principal panel being provided on the side panel.

10. The wire harness protector according to claim 7, wherein the plate is configured with a principal panel into which the excavated portions are recessed and a side panel rising up from an outer edge of the principal panel, a plurality of aligned channels extending in a direction rising up from the principal panel being provided on the side panel.

* * * * *